(12) United States Patent
Reddy et al.

(10) Patent No.: US 9,520,776 B1
(45) Date of Patent: Dec. 13, 2016

(54) SELECTIVE BODY BIAS FOR CHARGE PUMP TRANSFER SWITCHES

(71) Applicant: SanDisk Technologies LLC, Plano, TX (US)

(72) Inventors: Gooty Sukumar Reddy, Anantapur (IN); Sridhar Yadala, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/989,666

(22) Filed: Jan. 6, 2016

Related U.S. Application Data

(60) Provisional application No. 62/220,479, filed on Sep. 18, 2015.

(51) Int. Cl.
| | |
|---|---|
| *G05F 1/10* | (2006.01) |
| *G05F 3/02* | (2006.01) |
| *H02M 3/07* | (2006.01) |
| *G11C 16/14* | (2006.01) |
| *G11C 16/26* | (2006.01) |
| *G11C 16/24* | (2006.01) |

(52) U.S. Cl.
CPC ............. *H02M 3/07* (2013.01); *G11C 16/14* (2013.01); *G11C 16/24* (2013.01); *G11C 16/26* (2013.01)

(58) Field of Classification Search
CPC .. H02M 3/073; H02M 3/07; H02M 2003/077; G11C 5/145; G05F 3/205
USPC ........................................................ 327/536
See application file for complete search history.

(56) References Cited

U.S. PATENT DOCUMENTS

| | | |
|---|---|---|
| 3,697,860 A | 10/1972 | Donal |
| 4,271,461 A | 6/1981 | Hoffmann et al. |
| 4,511,811 A | 4/1985 | Gupta |
| 4,583,157 A | 4/1986 | Kirsch et al. |
| 4,621,315 A | 11/1986 | Vaughn et al. |
| 4,636,748 A | 1/1987 | Latham, II |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |

(Continued)

FOREIGN PATENT DOCUMENTS

| | | |
|---|---|---|
| CN | 101764518 A | 6/2010 |
| CN | 101882928 A | 11/2010 |

(Continued)

OTHER PUBLICATIONS

Ang et al., "An On-Chip Voltage Regulator Using Switched Decoupling Capacitors," Feb. 2000 IEEE International Solid-State Circuits Conference, 2 pages.

(Continued)

*Primary Examiner* — Quan Tra
(74) *Attorney, Agent, or Firm* — Stoel Rives LLP

(57) ABSTRACT

Techniques are presented for improving the efficiencies of multi-stage charge pumps by reducing the amount of voltage lost across the inter-stage transfer switches of the pump through use a selective body bias. The voltage level from both branches of one stage is each supplied though a corresponding diode to the bulk connection of the transfer switch after the subsequent stage in both branches. This arrangement results in each stage providing a largely uniform amount of gain, without the usual increase of voltage drop with increasing numbers of stages.

20 Claims, 6 Drawing Sheets

(56) References Cited

U.S. PATENT DOCUMENTS

| | | |
|---|---|---|
| 5,175,706 A | 12/1992 | Edme |
| 5,263,000 A | 11/1993 | Buskirk et al. |
| 5,335,198 A | 8/1994 | Buskirk et al. |
| 5,392,205 A | 2/1995 | Zavaleta |
| 5,432,469 A | 7/1995 | Tedrow et al. |
| 5,436,587 A | 7/1995 | Cernea |
| 5,483,434 A | 1/1996 | Seesink |
| 5,508,971 A | 4/1996 | Cernea |
| 5,521,547 A | 5/1996 | Tsukada |
| 5,539,351 A | 7/1996 | Gilsdorf et al. |
| 5,553,030 A | 9/1996 | Tedrow et al. |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik |
| 5,635,776 A | 6/1997 | Imi |
| 5,644,534 A | 7/1997 | Soejima |
| 5,693,570 A | 12/1997 | Cernea et al. |
| 5,712,778 A | 1/1998 | Moon |
| 5,732,039 A | 3/1998 | Javanifard et al. |
| 5,734,286 A | 3/1998 | Takeyama et al. |
| 5,734,290 A | 3/1998 | Chang et al. |
| 5,767,735 A | 6/1998 | Javanifard et al. |
| 5,781,473 A | 7/1998 | Javanifard et al. |
| 5,801,987 A | 9/1998 | Dinh |
| 5,812,017 A | 9/1998 | Golla et al. |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,969,988 A | 10/1999 | Tanzawa et al. |
| 5,973,546 A | 10/1999 | Le et al. |
| 5,978,283 A | 11/1999 | Hsu et al. |
| 5,982,222 A | 11/1999 | Kyung |
| 5,982,224 A * | 11/1999 | Chung .................. H02M 3/073 307/110 |
| 6,008,690 A | 12/1999 | Takeshima et al. |
| 6,011,440 A | 1/2000 | Bell et al. |
| 6,016,073 A | 1/2000 | Ghilardelli et al. |
| 6,018,264 A | 1/2000 | Jin et al. |
| 6,023,187 A | 2/2000 | Camacho et al. |
| 6,026,002 A | 2/2000 | Viehmann |
| 6,100,557 A | 8/2000 | Hung et al. |
| 6,104,225 A | 8/2000 | Taguchi et al. |
| 6,107,862 A | 8/2000 | Mukainakano et al. |
| 6,134,145 A | 10/2000 | Wong |
| 6,147,566 A | 11/2000 | Pizzuto et al. |
| 6,151,229 A | 11/2000 | Taub et al. |
| 6,154,088 A | 11/2000 | Chevallier et al. |
| 6,157,242 A | 12/2000 | Fukui et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,272,029 B1 | 8/2001 | Hirose |
| 6,275,096 B1 | 8/2001 | Hsu et al. |
| 6,278,294 B1 | 8/2001 | Taniguchi |
| 6,285,622 B1 | 9/2001 | Haraguchi et al. |
| 6,288,601 B1 | 9/2001 | Tomishima |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo |
| 6,320,797 B1 | 11/2001 | Liu |
| 6,329,869 B1 | 12/2001 | Matano |
| 6,333,873 B1 | 12/2001 | Kumanoya et al. |
| 6,341,087 B1 | 1/2002 | Kunikiyo |
| 6,344,959 B1 | 2/2002 | Milazzo |
| 6,344,984 B1 | 2/2002 | Miyazaki |
| 6,356,062 B1 | 3/2002 | Elmhurst et al. |
| 6,356,499 B1 | 3/2002 | Banba et al. |
| 6,359,798 B1 | 3/2002 | Han et al. |
| 6,369,642 B1 | 4/2002 | Zeng |
| 6,370,075 B1 | 4/2002 | Haeberli et al. |
| 6,385,107 B1 | 5/2002 | Bedarida et al. |
| 6,400,202 B1 | 6/2002 | Fifield et al. |
| 6,404,274 B1 | 6/2002 | Hosono et al. |
| 6,411,157 B1 | 6/2002 | Hsu et al. |
| 6,424,570 B1 | 7/2002 | Le et al. |
| 6,445,243 B2 | 9/2002 | Myono |
| 6,456,154 B2 | 9/2002 | Sugimura |
| 6,456,170 B1 | 9/2002 | Segawa et al. |
| 6,476,666 B1 | 11/2002 | Palusa et al. |
| 6,486,728 B2 | 11/2002 | Kleveland |
| 6,501,325 B1 | 12/2002 | Meng |
| 6,518,830 B2 | 2/2003 | Gariboldi et al. |
| 6,522,191 B1 | 2/2003 | Cha |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Haeberli et al. |
| 6,577,535 B2 | 6/2003 | Pasternak |
| 6,606,267 B2 | 8/2003 | Wong |
| 6,661,682 B2 | 12/2003 | Kim et al. |
| 6,703,891 B2 | 3/2004 | Tanaka et al. |
| 6,724,241 B1 | 4/2004 | Bedarida et al. |
| 6,734,718 B1 | 5/2004 | Pan |
| 6,737,887 B2 | 5/2004 | Forbes et al. |
| 6,737,907 B2 | 5/2004 | Hsu et al. |
| 6,760,262 B2 | 7/2004 | Haeberli et al. |
| 6,762,640 B2 | 7/2004 | Katsuhisa |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,841,981 B2 | 1/2005 | Smith et al. |
| 6,859,091 B1 | 2/2005 | Nicholson |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hausmann |
| 6,944,058 B2 | 9/2005 | Wong |
| 6,954,386 B2 | 10/2005 | Narui et al. |
| 6,975,135 B1 | 12/2005 | Bui |
| 6,985,397 B2 | 1/2006 | Tokui |
| 6,990,031 B2 | 1/2006 | Hashimoto et al. |
| 6,995,603 B2 | 2/2006 | Chen et al. |
| 6,999,327 B2 | 2/2006 | Smith et al. |
| 7,002,381 B1 | 2/2006 | Chung |
| 7,023,260 B2 | 4/2006 | Thorp et al. |
| 7,030,683 B2 | 4/2006 | Pan et al. |
| 7,046,076 B2 | 5/2006 | Daga et al. |
| 7,092,263 B2 | 8/2006 | Chang |
| 7,113,023 B2 | 9/2006 | Cernea |
| 7,116,154 B2 | 10/2006 | Guo |
| 7,116,155 B2 | 10/2006 | Pan |
| 7,119,624 B2 | 10/2006 | Gomez |
| 7,120,051 B2 | 10/2006 | Gorobets et al. |
| 7,123,078 B2 | 10/2006 | Seo |
| 7,129,538 B2 | 10/2006 | Lee et al. |
| 7,129,759 B2 | 10/2006 | Fukami |
| 7,135,910 B2 | 11/2006 | Cernea |
| 7,135,911 B2 | 11/2006 | Imamiya |
| 7,135,934 B2 | 11/2006 | Sanchez et al. |
| 7,145,382 B2 | 12/2006 | Ker et al. |
| 7,180,794 B2 | 2/2007 | Matsue |
| 7,205,682 B2 | 4/2007 | Kuramori |
| 7,208,996 B2 | 4/2007 | Suzuki et al. |
| 7,215,179 B2 | 5/2007 | Yamazoe et al. |
| 7,224,591 B2 | 5/2007 | Kaishita et al. |
| 7,227,780 B2 | 6/2007 | Komori et al. |

(56) References Cited

U.S. PATENT DOCUMENTS

| | | |
|---|---|---|
| 7,239,192 B2 | 7/2007 | Tailliet |
| 7,253,675 B2 | 8/2007 | Aksin et al. |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,335 B2 | 3/2008 | Watanabe |
| 7,348,829 B2 | 3/2008 | Choy et al. |
| 7,368,979 B2 | 5/2008 | Govindu et al. |
| 7,382,176 B2 | 6/2008 | Ayres et al. |
| 7,391,630 B2 | 6/2008 | Acatrinei |
| 7,397,677 B1 | 7/2008 | Collins et al. |
| 7,436,241 B2 | 10/2008 | Chen et al. |
| 7,466,188 B2 | 12/2008 | Fifield |
| 7,468,628 B2 | 12/2008 | Im et al. |
| 7,495,471 B2 | 2/2009 | Perisetty |
| 7,495,500 B2 | 2/2009 | Al-Shamma et al. |
| 7,515,488 B2 | 4/2009 | Thorp et al. |
| 7,521,978 B2 | 4/2009 | Kim et al. |
| 7,554,311 B2 | 6/2009 | Pan |
| 7,558,129 B2 | 7/2009 | Thorp et al. |
| 7,579,902 B2 | 8/2009 | Frulio et al. |
| 7,579,903 B2 | 8/2009 | Oku |
| 7,586,362 B2 | 9/2009 | Pan et al. |
| 7,602,233 B2 | 10/2009 | Pietri et al. |
| 7,667,529 B2 | 2/2010 | Consuelo et al. |
| 7,671,572 B2 | 3/2010 | Chung |
| 7,683,700 B2 | 3/2010 | Huynh et al. |
| 7,696,812 B2 | 4/2010 | Al-Shamma et al. |
| 7,702,043 B2 | 4/2010 | Smith et al. |
| 7,741,898 B2 | 6/2010 | Hsu |
| 7,742,358 B2 | 6/2010 | Nakai et al. |
| 7,772,914 B2 | 8/2010 | Jung |
| 7,795,952 B2 | 9/2010 | Lui et al. |
| 7,830,203 B2 | 11/2010 | Chang et al. |
| 7,928,796 B2 | 4/2011 | Namekawa |
| 7,944,277 B1 | 5/2011 | Sinitsky et al. |
| 7,944,279 B1 | 5/2011 | Waffaoui |
| 7,948,301 B2 | 5/2011 | Cook et al. |
| 7,956,673 B2 | 6/2011 | Pan |
| 7,956,675 B2 | 6/2011 | Saitoh et al. |
| 7,969,235 B2 | 6/2011 | Pan |
| 7,973,592 B2 | 7/2011 | Pan |
| 7,986,160 B2 | 7/2011 | Hoang et al. |
| 8,040,184 B2 | 10/2011 | Tsuchiya |
| 8,044,705 B2 | 10/2011 | Nandi et al. |
| 8,093,953 B2 | 1/2012 | Pierdomenico et al. |
| 8,159,091 B2 | 4/2012 | Yeates |
| 8,193,853 B2 | 6/2012 | Hsieh et al. |
| 8,242,834 B2 | 8/2012 | Chuang et al. |
| 8,258,857 B2 | 9/2012 | Adkins et al. |
| 8,294,509 B2 | 10/2012 | Pan et al. |
| 8,339,183 B2 | 12/2012 | Htoo et al. |
| 8,339,185 B2 | 12/2012 | Cazzaniga et al. |
| 8,358,150 B1 | 1/2013 | Snyder et al. |
| 8,395,440 B2 | 3/2013 | Sandhu et al. |
| 8,405,450 B2 | 3/2013 | Ucciardello et al. |
| 8,493,040 B2 | 7/2013 | Gunther et al. |
| 8,537,593 B2 | 9/2013 | Huynh et al. |
| 8,604,868 B2 | 12/2013 | Ucciardello et al. |
| 8,643,358 B2 | 2/2014 | Yoon |
| 8,699,247 B2 | 4/2014 | Nguyen et al. |
| 8,710,908 B2 | 4/2014 | Lin et al. |
| 8,717,699 B1 | 5/2014 | Ferris |
| 8,817,553 B2 | 8/2014 | Yu et al. |
| 2002/0008566 A1 | 1/2002 | Taito et al. |
| 2002/0014908 A1 | 2/2002 | Lauterbach |
| 2002/0075063 A1 | 6/2002 | Hwang |
| 2002/0075706 A1 | 6/2002 | Foss et al. |
| 2002/0101744 A1 | 8/2002 | DeMone |
| 2002/0130701 A1 | 9/2002 | Kleveland |
| 2002/0130704 A1 | 9/2002 | Myono et al. |
| 2002/0140463 A1 | 10/2002 | Cheung |
| 2002/0163376 A1 | 11/2002 | Pappalardo et al. |
| 2003/0128560 A1 | 7/2003 | Saiki et al. |
| 2003/0214346 A1 | 11/2003 | Pelliconi |
| 2003/0231566 A1 | 12/2003 | Smith et al. |
| 2004/0046603 A1 | 3/2004 | Bedarida et al. |
| 2004/0263238 A1 | 12/2004 | Thorp et al. |
| 2005/0024125 A1 | 2/2005 | Mcnitt et al. |
| 2005/0030088 A1 | 2/2005 | Cernea |
| 2005/0093614 A1 | 5/2005 | Lee |
| 2005/0104572 A1 | 5/2005 | Smith et al. |
| 2005/0146375 A1 | 7/2005 | Ker et al. |
| 2005/0162145 A1 | 7/2005 | Smith et al. |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0098505 A1 | 5/2006 | Cho et al. |
| 2006/0114053 A1 | 6/2006 | Sohara et al. |
| 2006/0119393 A1 | 6/2006 | Hua et al. |
| 2006/0202828 A1 | 9/2006 | Shanks et al. |
| 2006/0244518 A1 | 11/2006 | Byeon et al. |
| 2006/0250177 A1 | 11/2006 | Thorp |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0152738 A1 | 7/2007 | Stopel et al. |
| 2007/0210853 A1 | 9/2007 | Maejima |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0012627 A1 | 1/2008 | Kato |
| 2008/0024096 A1 | 1/2008 | Pan |
| 2008/0024198 A1 | 1/2008 | Bitonti et al. |
| 2008/0042731 A1 | 2/2008 | Daga et al. |
| 2008/0068067 A1 | 3/2008 | Govindu et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157731 A1 | 7/2008 | Pan |
| 2008/0157852 A1 | 7/2008 | Pan |
| 2008/0157859 A1 | 7/2008 | Pan |
| 2008/0169864 A1* | 7/2008 | Yamahira ............... G11C 5/145 327/536 |
| 2008/0174360 A1 | 7/2008 | Hsu |
| 2008/0186081 A1 | 8/2008 | Yamahira et al. |
| 2008/0218134 A1 | 9/2008 | Kawakami et al. |
| 2008/0239802 A1 | 10/2008 | Thorp et al. |
| 2008/0239856 A1 | 10/2008 | Thorp et al. |
| 2008/0278222 A1 | 11/2008 | Conte et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0121782 A1 | 5/2009 | Oyama et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0184697 A1 | 7/2009 | Park |
| 2009/0219077 A1 | 9/2009 | Pietri et al. |
| 2009/0219079 A1 | 9/2009 | Bergler et al. |
| 2009/0265464 A1* | 10/2009 | Jakobson ............... H02M 3/073 327/536 |
| 2009/0296488 A1 | 12/2009 | Nguyen et al. |
| 2009/0315598 A1 | 12/2009 | Namekawa |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0033232 A1 | 2/2010 | Pan |
| 2010/0074034 A1 | 3/2010 | Cazzaniga |
| 2010/0085794 A1 | 4/2010 | Chen et al. |
| 2010/0118625 A1 | 5/2010 | Matano |
| 2010/0127761 A1 | 5/2010 | Matano |
| 2010/0244935 A1 | 9/2010 | Kim et al. |

(56) References Cited

U.S. PATENT DOCUMENTS

| | | |
|---|---|---|
| 2010/0283549 A1 | 11/2010 | Wang |
| 2010/0302877 A1 | 12/2010 | Bang |
| 2011/0026329 A1 | 2/2011 | Wada |
| 2011/0068857 A1 | 3/2011 | Ucciardello et al. |
| 2011/0133820 A1 | 6/2011 | Pan |
| 2011/0133821 A1 | 6/2011 | Honda |
| 2011/0148509 A1 | 6/2011 | Pan et al. |
| 2011/0156803 A1 | 6/2011 | Yap et al. |
| 2011/0169557 A1 | 7/2011 | Yamahira et al. |
| 2011/0176370 A1 | 7/2011 | Izumi et al. |
| 2011/0254615 A1 | 10/2011 | Raghunathan et al. |
| 2012/0161857 A1* | 6/2012 | Sakaguchi ............. H02M 3/07 327/536 |
| 2012/0230071 A1 | 9/2012 | Kaneda |
| 2012/0274394 A1 | 11/2012 | Chan |
| 2013/0162229 A1 | 6/2013 | Chan |
| 2013/0181521 A1 | 7/2013 | Khlat |
| 2013/0221938 A1 | 8/2013 | Conte et al. |
| 2014/0084936 A1 | 3/2014 | Pan et al. |
| 2014/0085985 A1 | 3/2014 | Pan et al. |
| 2014/0375293 A1 | 12/2014 | Pan et al. |

FOREIGN PATENT DOCUMENTS

| | | |
|---|---|---|
| CN | 101902059 A | 12/2010 |
| DE | 10 2007 026290 A1 | 7/2008 |
| EP | 0 382 929 A2 | 8/1990 |
| EP | 0 780 515 A1 | 6/1997 |
| EP | 1 362 320 A2 | 11/2003 |
| EP | 1 925 062 | 5/2008 |
| JP | 2007-020268 A | 1/2007 |
| WO | WO-0106336 A1 | 1/2001 |
| WO | WO-02065380 A2 | 8/2002 |
| WO | WO-2006132757 A2 | 12/2006 |
| WO | WO-2007026289 A1 | 3/2007 |

OTHER PUBLICATIONS

Pan, "Charge Pump Circuit Design," McGraw-Hill, 2006, 26 pages.
Pylarinos et al., "Charge Pumps: An Overview," Department of Electrical and Computer Engineering, University of Toronto, Proceedings of Symposium May 2003, 7 pages.

* cited by examiner

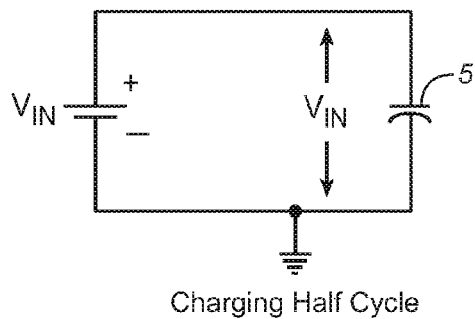
FIG. 1A Charging Half Cycle
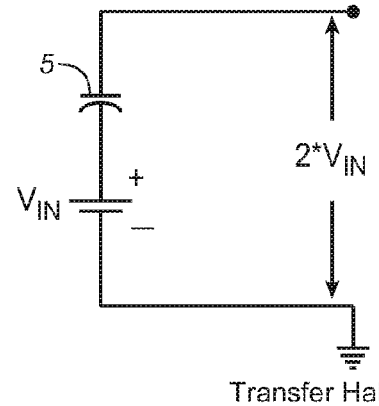
FIG. 1B Transfer Half Cycle
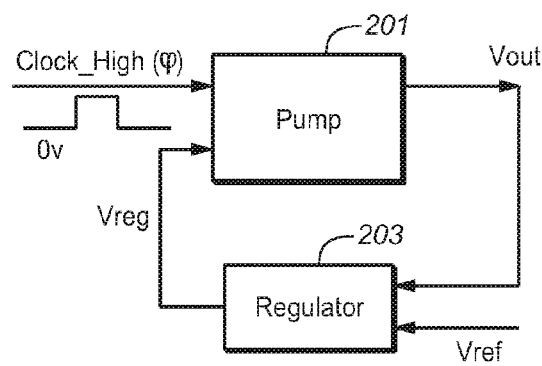
FIG. 2

SELECTIVE BODY BIAS FOR CHARGE PUMP TRANSFER SWITCHES

CROSS-REFERENCE TO RELATED APPLICATION

This application claims priority from, U.S. Provisional Applications Nos. 62/220,479, filed on Sep. 18, 2015, which is hereby incorporated in its entirety by this reference.

BACKGROUND

This following pertains generally to the field of charge pumps and more particularly to techniques for improving the efficiency of charge pumps.

Charge pumps use a combination of switches and capacitors to provide a DC output voltage higher or lower than its DC input voltage. To generate the required output, transfer of charge from input to output happens through Capacitors and switches. During one clock half cycle, the charging half cycle, the capacitor couples in parallel to the input so as to charge up to the input voltage. During a second half cycle, the boost half cycle, the charged capacitor's bottom plate is boosted with the input voltage so as to provide an output voltage twice the level of the input voltage. This process is illustrated in FIGS. 1A and 1B. In FIG. 1A, the capacitor 5 is arranged in parallel with the input voltage $V_{IN}$ to illustrate the charging half cycle. In FIG. 1B, the charged capacitor 5 is arranged in series with the input voltage to illustrate the transfer half cycle. As seen in FIG. 1B, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as sensing, programming or erase voltages, from a lower power supply voltage. A number of charge pump designs, such as conventional Dickson-type pumps, are know in the art. But given the common reliance upon charge pumps, there is an on going need for improvements in pump design and improving their efficiency.

SUMMARY

A charge pump has first and second branches connected in parallel between a supply node and an output node. Each of the branches includes multiple stages connected in series, the first of which is connected to the supply node though a respective initial switch. Each of the stages has a stage capacitor, a stage node connected to the corresponding stage capacitor, and a transfer switch, through which the corresponding stage node is connected to the stage node of the subsequent stage in the series, except for the final stage of the series, whose stage node is connected through the corresponding transfer switch to the output node. When the charge pump is enabled, even and odd stages in the series of the first branch are respectively connected to receive first and second clock non-overlapping clock signals and even and odd stages in the series of the second branch are respectively connected to receive the second and first clock signals. The charge pump also includes first and second diodes through which the stage node of a first one of the stages in the series of both of the first and second branches are respectively connected to provide, for both of the first and second branches, the body bias of the transfer switches of the stage subsequent to the first one of the stages.

An integrated circuit includes an array of non-volatile memory cells; read, write, and erase circuitry connected to the array; and a charge pump. The charge pump has first and second branches connected in parallel between a supply node and an output node connectable to supply the read, write, and erase circuitry, wherein each of the branches includes multiple stages connected in series, the first of which is connected to the supply node though a respective initial switch. Each of the stages has a stage capacitor, a stage node connected to the corresponding stage capacitor, and a transfer switch, through which the corresponding stage node is connected to the stage node of the subsequent stage in the series, except for the final stage of the series, whose stage node is connected through the corresponding transfer switch to the output node. When the charge pump is enabled, even and odd stages in the series of the first branch are respectively connected to receive first and second clock non-overlapping clock signals and even and odd stages in the series of the second branch are respectively connected to receive the second and first clock signals. The charge pump also includes first and second diodes. The first and second diodes are connected through the stage node of a first one of the stages in the series of both of the first and second branches are respectively connected, for both of the first and second branches, to bias the body of the transfer switches of the stage subsequent to the first one of the stages.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 1A is a simplified circuit diagram of the charging half cycle in a generic charge pump.

FIG. 1B is a simplified circuit diagram of the transfer half cycle in a generic charge pump.

FIG. 2 is a top-level block diagram for a regulated charge pump.

DETAILED DESCRIPTION

Figure 3:
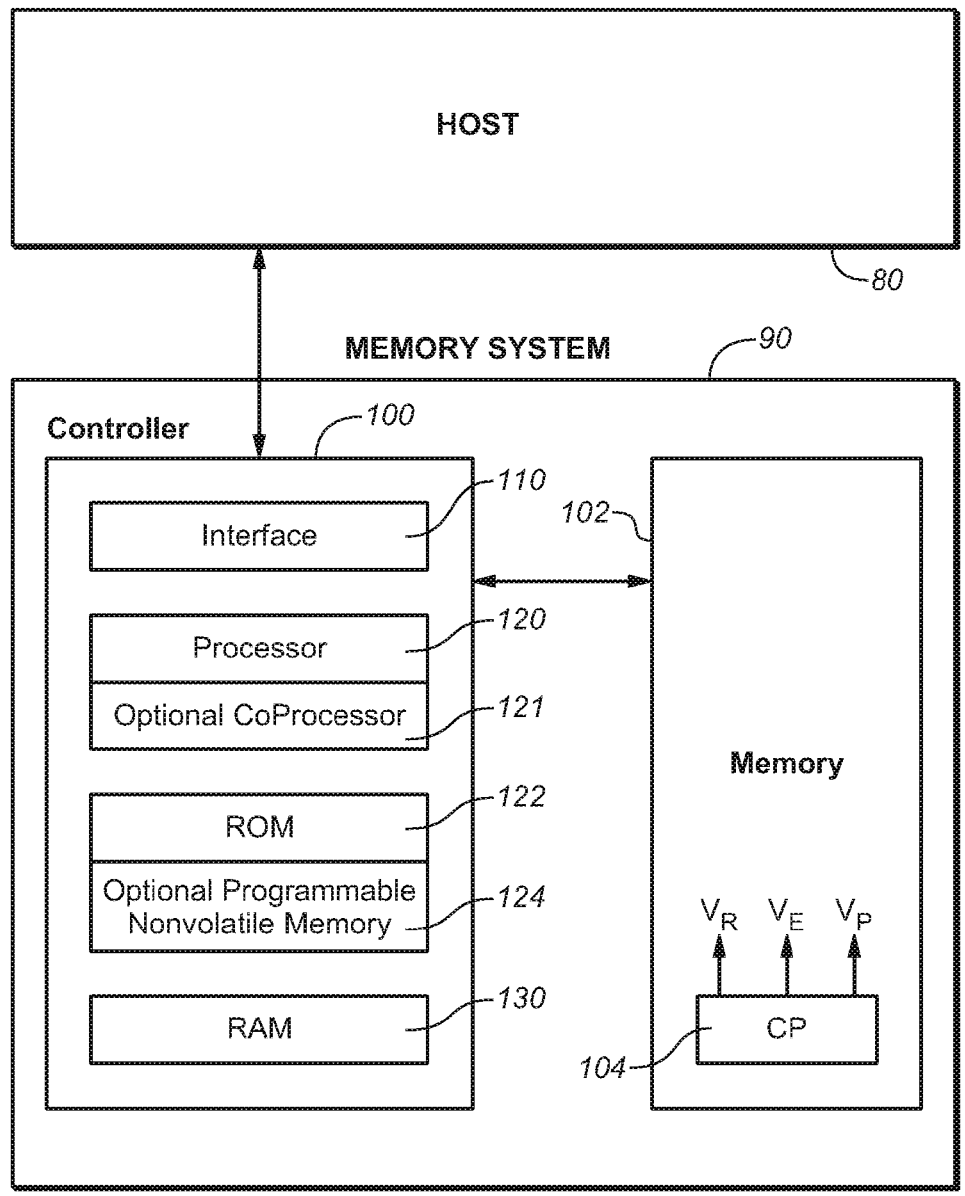
FIG. 3 is a schematic representation of a non-volatile memory system, in which charge pumps are commonly used.

The techniques presented here are widely applicable to various charge pump designs to reduce overall power consumption for charge pump system and for reducing switching current. As noted in the Background, non-volatile memory systems often are designed for use with relative low voltage power supplies, but need higher voltage levels to perform various read, write and erase operations. For example, with NAND Memory applications, such as for 2D NAND or 3D devices such as of the BiCS type, elements such as bit line drivers and various op-amps use higher (2×-3×) than the given supply voltage. These voltages are generated by the charge pump circuitry on the memory chips that can be the major power consuming circuitry on the circuit. Furthermore these pumps are typically designed to operate at the single clock frequency at which the pump performance meets the worst case load conditions. This will result in high switching and high switching current at the lower loads. The techniques presented here can help to minimize the pump switching frequency according to the load current requirement, consequently minimizing the corresponding switching current. Although the following discussion is often given in the context of using a charge pump for a memory circuit, the techniques described are more generally applicable to other circuits where boosted voltage levels are needed.

FIG. 2 is a top-level block diagram of a typical charge pump using an output voltage based regulation scheme. As shown in FIG. 2, the pump 201 has as inputs a clock signal and a voltage Vreg and provides an output Vout. The clock generation circuit is not explicitly shown in FIG. 2, although it may be considered part of the charge pump system in some embodiments or taken as an external input. The high (Vdd) and low (ground) connections are also not explicitly shown. The voltage Vreg is provided by the regulator 203, which has as inputs a reference voltage Vref from an external voltage source and the output voltage Vout. The regulator block 203 generates feedback control signal Vreg such that the desired value of Vout can be obtained. The pump section 201 may have any of various designs for charge pumps, including charge doubler-type circuits with cross-coupled elements as well as the Dickson-type pumps. (A charge pump is typically taken to refer to both the pump portion 201 and the regulator 203, when a regulator is included, although in some usages "charge pump" refers to just the pump section 201. In the following, the terminology "charge pump system" will often be used to describe pump itself as well as any regulation circuitry or other associated elements).

FIG. 3 illustrates schematically the main hardware components of a memory system that includes an integrated non-volatile memory circuit such as that on which a charge pump might be used as a peripheral element for generating needed operating voltages. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein. More detail on such memory devices and systems is given in U.S. patent application Ser. No. 14/528,711 filed on Oct. 30, 2014.

For NAND memory applications, program, erase, and read operations often use high voltages in the range of 10-30V, while the chip supply level may be in the order of 2.3 to 3.6V. These high voltage supplies are generated through charge pump circuits. Typically high voltage charge pump designs uses high voltage devices. These devices have high body bias coefficients, which results in increased threshold voltage (VTH) and degraded device performance at higher voltages. The following presents techniques to reduce the voltage losses that typically arise in the transfer switches used in charge pumps.

Figure 4A:
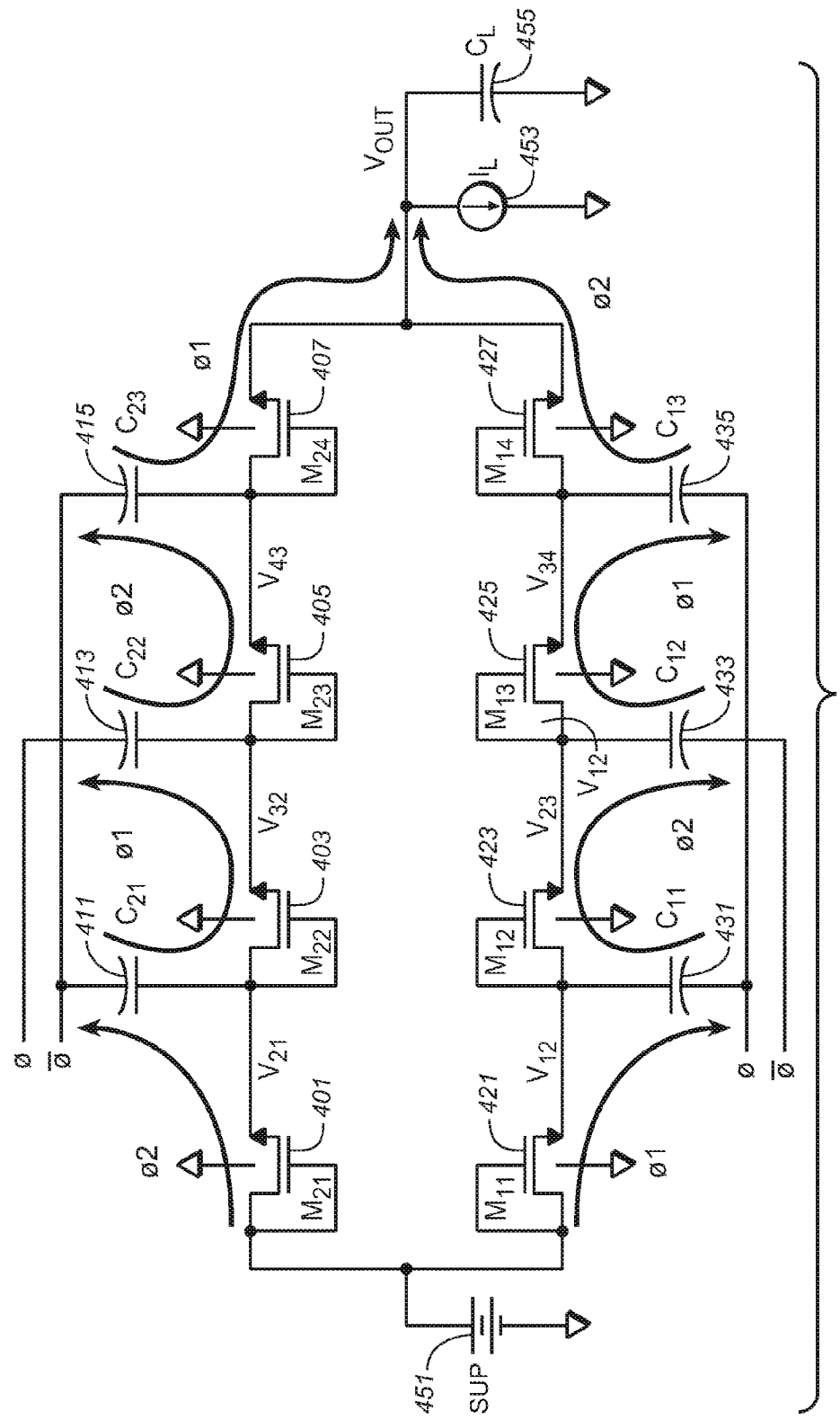
FIGS. 4A and 4B illustrate a 3-stage, 2-phase Dickson charge pump and a correspond timing diagram with the level at each stage.

In a typical charge pump arrangement, multiple stages connected in series by transfer switches are used to generate higher voltages, with two legs or branches of opposite phase. A number of topologies can be used for the individual stages, including voltage doublers, four-phase, and Dickson type pumps, among other. The following discussion is based on a Dickson type topology, but can also be applied to the transfer switches of other designs, such as voltage doubles, four-phase, and so on Using a simple 3-stage, 2-phase Dickson charge pump as the exemplary embodiment to consider the situation further, FIG. 4A shows such a charge pump that is implemented with zero threshold voltage (VTH) devices, low threshold voltage devices or intrinisic devices, whose bulk is connected to the ground. The two legs or branches are connected in series between a supply node connected to a voltage source SUP 451 and at an output node to supply an output voltage $V_{out}$ to a load, represented by a current $I_L$ 453 and a capacitance $C_L$ 455. For example, $V_{out}$ could be a read, write or erase level supplied to a word line or other circuit element. The top branch has an initial switch $M_{21}$ 401 connecting the supply level to the first stage node, followed by a transfer switch $M_{22}$ 403, $M_{23}$ 405, and $M_{24}$ 407 connecting the node of one stage to that of the next, except for the final stages the supplies the output. The body of each switch is connected to ground. Each stage node, labelled by its voltage level $V_{21}$, $V_{32}$, $V_{43}$ is connected to a plate of a corresponding stage capacitor $C_{21}$ 411, $C_{22}$, 413, $C_{23}$ 415. The other plate of the capacitor is connected to receive a clock signal ϕ for the even stages and its inverse $\bar{\phi}$ (or other non-overlapping clock signal) for the odd stages, where the clock signals can be from a clock generator (not shown) on the device. The bottom branch is similarly arranged, but with the phase of the clock signals switched for the even and odd stages.

Figure 4B:
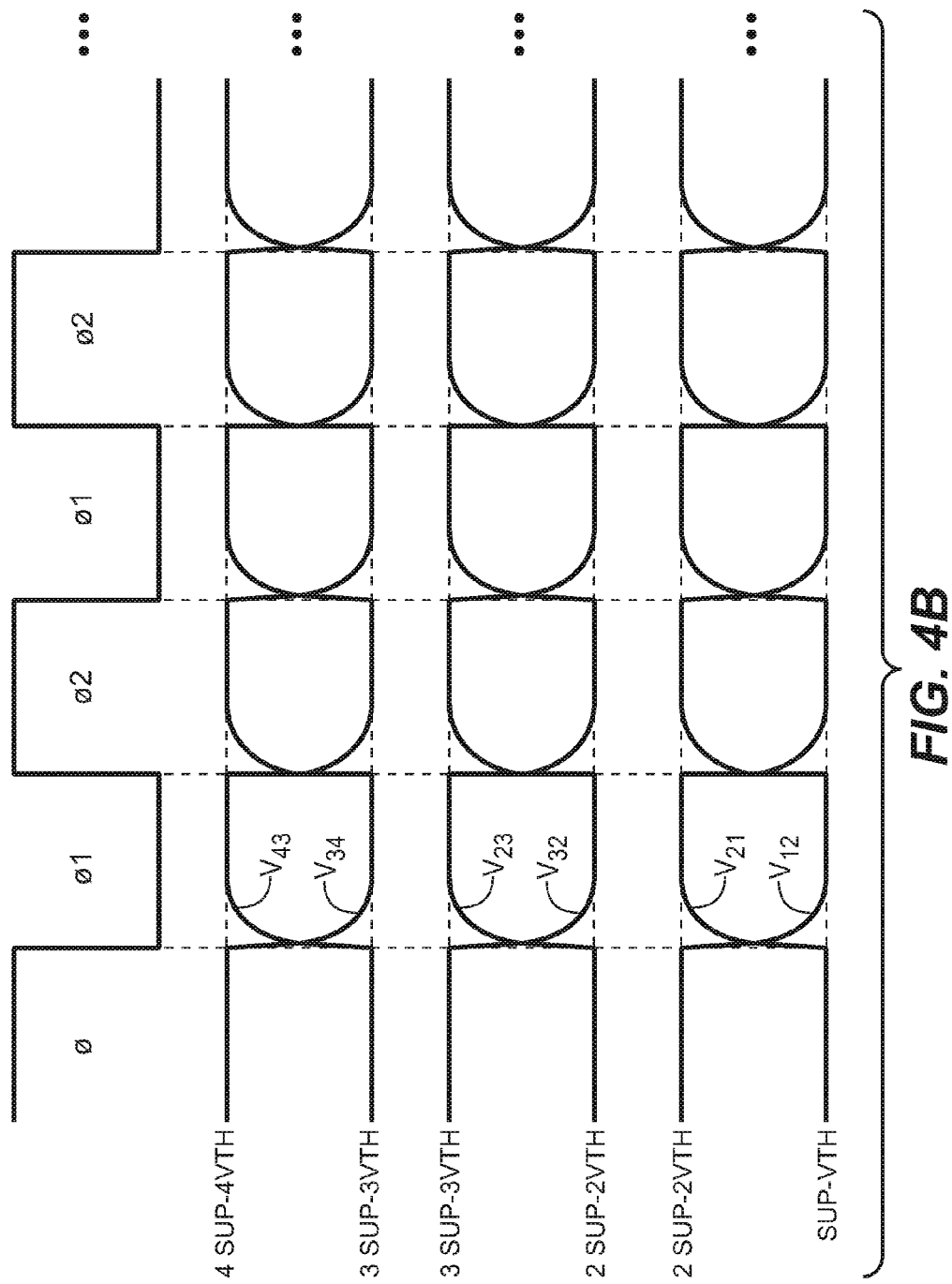

The timing diagram of the charge pump of FIG. 4A is shown in FIG. 4B. The top trace is for the clock, under which are the levels on the nodes for each of the stages. During the ϕ1 phase, $\bar{\phi}$ goes high and $C_{23}$ 415 will support the load through the $M_{24}$ 407. This path is highlighted by the right-most top arrow in FIG. 4A, and corresponding charge transfers during ϕ2 are also highlighted. Similarly when ϕ goes to high, $C_{13}$ 435 will be supporting the load through the $M_{14}$ as highlighted by the right-most arrow on the bottom and corresponding charge transfers during ϕ2 are also highlighted. Ignoring losses in the transfer switches, V21/V12 are switching between SUP and 2SUP, V12/V22 are switching between 2SUP and 3SUP and V13/V23 are switching between 3SUP and 4SUP. However, under this arrangement, the amount of the threshold voltage of each switch is lost at each of the switches, so that 4*SUP-4VTH is supplied at the output, rather than 4*SUP.

Consequently, a significant portion of the boosted voltage can be lost to the transfer switches, with the problem becoming more pronounced as the number of stages increase. A number of techniques have been introduced to deal with the problem. For example, one set of techniques involves boosting the gate voltages of the inter-stage transfer switches by various means, such as by an auxiliary pump.

Other techniques switch the bulk connections of the transfer gates back and forth between the minimum voltage of the device's source and drain. However, these arrangements typically have a number of undesirable features in terms of layout area, efficient, leakage, or some combination of these. To help overcome this issues, the embodiment of FIG. 5 uses a selective body biasing of the transfer switches.

Figure 5:
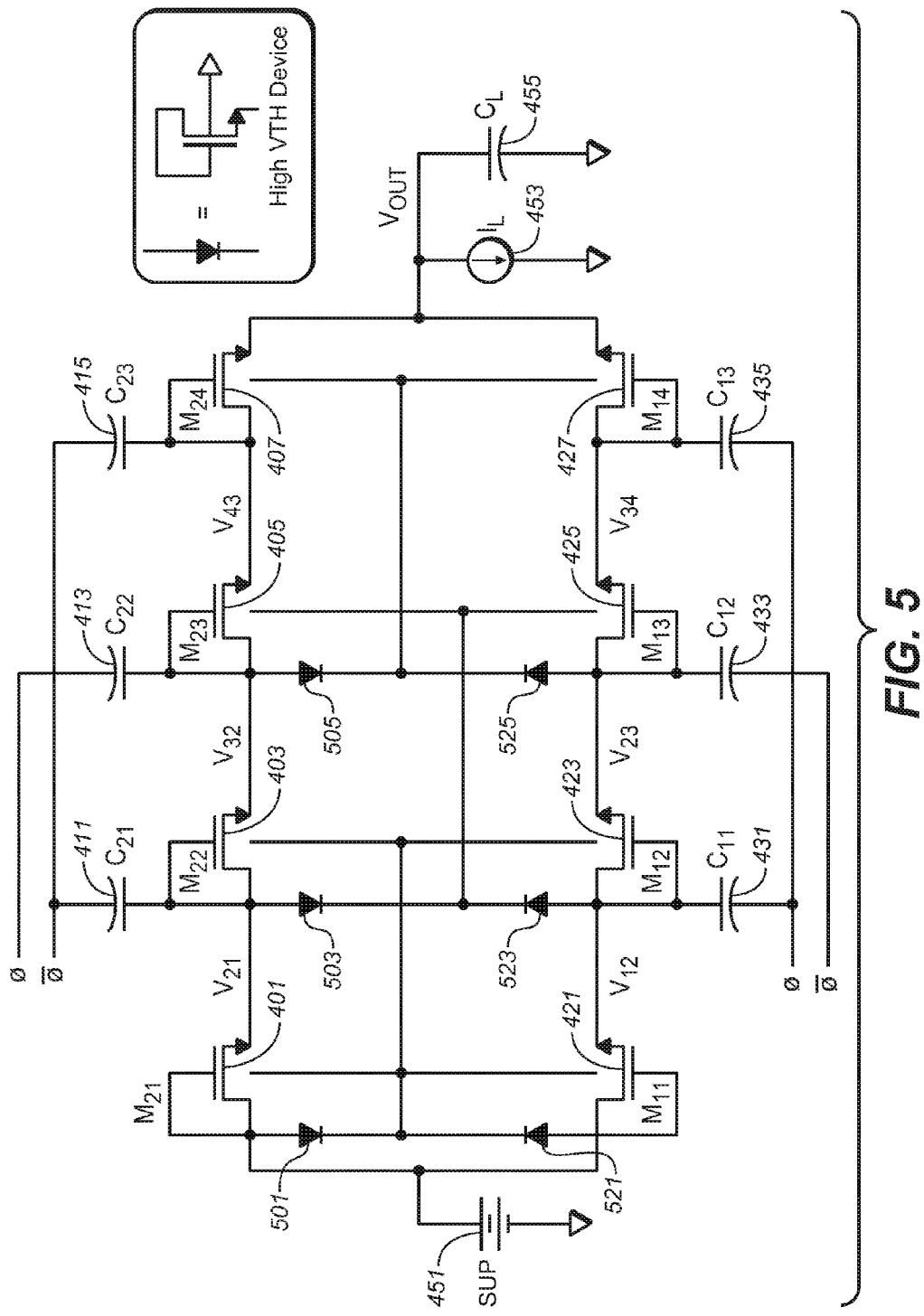
FIG. 5 shows an exemplary embodiment of a charge pump, again in a 3-stage, 2-phase Dickson-type context.

To ensure proper operation of MOSFETs of the transfer switches, the switch body voltage should be less than minimum of source and drain voltage, $V_{Body}<\text{mm}\ (V_{Source}\ V_{Drain})$. This can be achieved by sampling the maximum of the previous stage's outputs through the diodes as shown in FIG. 5. FIG. 5 includes the same elements as in FIG. 4, and these are similarly numbered, but body bias on the zero threshold devices has been changed from ground. The transfer switch out of each stage for each branch is commonly connected to the stage nodes of the preceding stage, each being connected through a corresponding one of a pair of diodes: the body of $M_{24}$ 407 and $M_{14}$ 427 are both connected to $V_{32}$, through diode 505, and $V_{23}$, through diode 525; the body of $M_{23}$ 405 and $M_{13}$ 425 are both connected to $V_{21}$, through diode 503, and $V_{12}$, through diode 523; and the body of $M_{21}$ 401, $M_{22}$ 403, $M_{11}$ 421, and $M_{12}$ 423 are all connected to SUP through diodes 501 and 521. The diodes can implemented as high Vth n-type MOS devices as shown in the detail of FIG. 5.

In the embodiment of FIG. 5, the bulk of M21, M22, M11, and M12 are connected to SUP through the first pair of diodes (501, 521), rather than directly to SUP. This allows for the technique to be applied to zero VTH devices or low VTH devices. In case of zero VTH devices, due to process variation and temperature, VTH can be negative. In such cases, where there is a negative VTH, there would be reverse leakage (that is, charge leaks back to the previous stage), resulting in efficiency reduction.

Looking at the $M_{24}$ device 407, for example, for the desired behavior the bulk would be min (VSource, VDrain), or min ([3SUP, 4SUP], (4SUP)), which is 3SUP. As 3SUP is max (V32, V23), this level can be generated by using the diode connection through 505 to the V32 node and through the diode 525 to the V23 node. Additionally, the diode drop will be available to make sure the VTH for the diodes is more than 0.

Figure 6A:
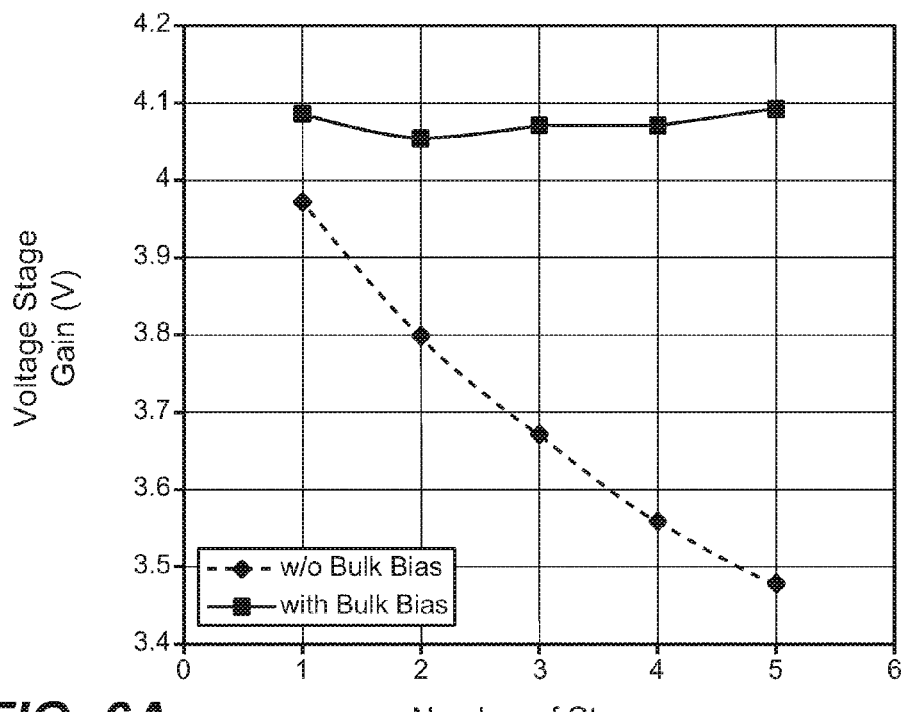
FIGS. 6A and 6B show simulation results of a Dickson-type charge pump embodiment with and without selective body bias.
Figure 6B:
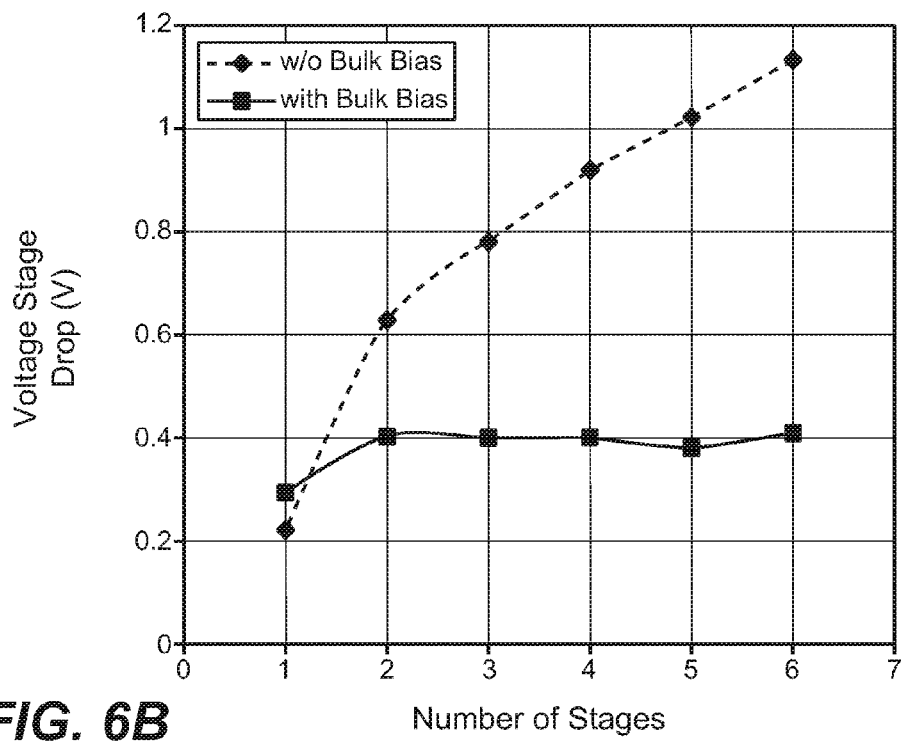

FIGS. 6A and 6B show simulation results of a Dickson-type charge pump embodiment with (as in FIG. 5, for a 3-stage version) and without (as in FIG. 4A, for a 3-stage version) selective body bias. In this simulation, the supply level is taken to be about 4.1-4.2V, although higher values can be used (such as around 6V) if device reliability, which is process dependent, permits. FIG. 6A shows the voltage gain per stage. Without the bulk bias, the gain shows diminishing returns as the number of stages goes up, as more and more voltage is lost across each subsequent transfer switch. Using the body bias arrangement as in FIG. 5 results in a largely uniform gain across all of the stages. Consequently, although includes the body biasing diodes may somewhat increase the number of elements for a given number of stages, in can reduce the overall number of devices as fewer stages may be needed due to the increased efficiencies. In the above gain refers to the increase in voltage from one stage to next stage. It is not the ratio of output voltage to input voltage as usually defined in the case of amplifiers.

FIG. 6B looks the voltage drop across the stages as the number of stages increases. With the described bulk biasing of the transfer switches, this remains largely uniform, while it increases in a roughly linear manner in the conventional arrangement.

The use of selective body bias is described above in the context of a 3-stage Dickson-type pump architecture, but readily extends to other numbers of stages and other types of multi-stage pumps, as this problem of voltage loss across the transfer switches is also found in these. In FIG. 5, only the pump circuit is shown, with the clock signals and supply level typically also coming other elements on an integrated circuit on which pump is formed, a common example of which is a memory circuit, although these techniques can be used in other circuits needing boosted voltage levels.

Regulation has not been considered in any detail, as the circuit of FIG. 5 would correspond to just the box 201 in a system such as is shown in FIG. 2. For regulated operation, any of the usually applicable regulation technique can be applied here, including varying of the clock frequency, varying of the clock amplitude, varying of the input SUP level, varying the number of stages, or combinations of these based on the output level of the pump.

The foregoing detailed description has been presented for purposes of illustration and description. It is not intended to be exhaustive or to limit the above to the precise form disclosed. Many modifications and variations are possible in light of the above teaching. The described examples were chosen in order to explain the principals involved and its practical application, to thereby enable others to best utilize the various embodiments and with various modifications as are suited to the particular use contemplated. It is intended that the scope be defined by the claims appended hereto.

It is claimed:

1. A charge pump, comprising:
  first and second branches connected in parallel between a supply node and an output node, wherein each of the branches includes a plurality of stages connected in series, the first of which is connected to the supply node though a respective initial switch, each stage having:
    a stage capacitor;
    a stage node connected to the corresponding stage capacitor; and
    a transfer switch, through which the corresponding stage node is connected to the stage node of the subsequent stage in the series, except for the final stage of the series, whose stage node is connected through the corresponding transfer switch to the output node,
  wherein, when the charge pump is enabled, even and odd stages in the series of the first branch are respectively connected to receive first and second clock non-overlapping clock signals and even and odd stages in the series of the second branch are respectively connected to receive the second and first clock signals; and
  first and second diodes through which the stage node of a first one of the stages in the series of both of the first and second branches are respectively connected to provide, for both of the first and second branches, a body bias of the transfer switches of the stage subsequent to the first one of the stages.

2. The charge pump of claim 1, wherein the transfer switches are transistor connected diodes having a gate connected to the corresponding stage node and the initial switches are diode connected transistors having a gate connected to the supply node.

3. The charge pump of claim 1, wherein for each of the stage capacitors, a first plate is connected to the corresponding stage node and a second plate is connected to receive the first clock signal for even stages of the first branch and odd stages of the second branch and to receive the second clock signal for odd stages of the first branch and even stages of the second branch.

4. The charge pump of claim 1, wherein the diodes are high threshold voltage devices.

5. The charge pump of claim 1, wherein the charge pump is formed on a non-volatile memory integrated circuit.

6. The charge pump of claim 5, wherein the charge pump generates programming voltages for use on the non-volatile memory integrated circuit.

7. The charge pump of claim 5, wherein the charge pump generates erase voltages for use on the non-volatile memory integrated circuit.

8. The charge pump of claim 5, wherein the charge pump generates sensing voltages for use on the non-volatile memory integrated circuit.

9. The charge pump of claim 5, wherein the non-volatile memory integrated circuit is a monolithic three-dimensional semiconductor memory device in which memory cells are arranged in multiple physical levels above a silicon substrate and word lines run in a horizontal direction relative to the substrate.

10. The charge pump of claim 1, wherein the first one of the stages in the series is the first stage of the series.

11. The charge pump of claim 1, wherein the first one of the stages in the series is the next to last stage in the series.

12. An integrated circuit, comprising:
an array of non-volatile memory cells;
read, write, and erase circuitry connected to the array; and
a charge pump, comprising:
first and second branches connected in parallel between a supply node and an output node connectable to supply the read, write, and erase circuitry, wherein each of the branches includes a plurality of stages connected in series, the first of which is connected to the supply node though a respective initial switch, each stage having:
a stage capacitor;
a stage node connected to the corresponding stage capacitor;
first and second diodes; and
a transfer switch, through which the corresponding stage node is connected to the stage node of the subsequent stage in the series, except for the final stage of the series, whose stage node is connected through the corresponding transfer switch to the output node,
wherein, when the charge pump is enabled, even and odd stages in the series of the first branch are respectively connected to receive first and second clock non-overlapping clock signals and even and odd stages in the series of the second branch are respectively connected to receive the second and first clock signals, and
wherein the first and second diodes are connected through the stage node of a first one of the stages in the series of both of the first and second branches are respectively connected, for both of the first and second branches, to bias the body of the transfer switches of the stage subsequent to the first one of the stages.

13. The integrated circuit of claim 12, wherein the transfer switches are transistor connected diodes having a gate connected to the corresponding stage node and the initial switches are diode connected transistors having a gate connected to the supply node.

14. The integrated circuit of claim 12, wherein for each of the stage capacitors, a first plate is connected to the corresponding stage node and a second plate is connected to receive the first clock signal for even stages of the first branch and odd stages of the second branch and to receive the second clock signal for odd stages of the first branch and even stages of the second branch.

15. The integrated circuit of claim 12, wherein the integrated circuit is a monolithic three-dimensional semiconductor memory device in which memory cells are arranged in multiple physical levels above a silicon substrate and word lines run in a horizontal direction relative to the substrate.

16. The integrated circuit of claim 12, wherein the first one of the stages in the series is the first stage of the series.

17. The integrated circuit of claim 12, wherein the first one of the stages in the series is the next to last stage in the series.

18. The integrated circuit of claim 12, wherein the charge pump generates programming voltages for the array.

19. The integrated circuit of claim 12, wherein the charge pump generates erase voltages for the array.

20. The integrated circuit of claim 12, wherein the charge pump generates sensing voltages for the array.

* * * * *